US012414226B2

(12) United States Patent
Artman et al.

(10) Patent No.: US 12,414,226 B2
(45) Date of Patent: Sep. 9, 2025

(54) ELECTRONIC DEVICE WITH BELOW PCB THERMAL MANAGEMENT

(71) Applicant: Advanced Micro Devices, Inc., Santa Clara, CA (US)

(72) Inventors: Paul Theodore Artman, Orlando, FL (US); Mark Steinke, Austin, TX (US); Gamal Refai-Ahmed, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 275 days.

(21) Appl. No.: 18/121,489

(22) Filed: Mar. 14, 2023

(65) Prior Publication Data
US 2024/0314919 A1  Sep. 19, 2024

(51) Int. Cl.
| H05K 1/00 | (2006.01) |
| H05K 1/02 | (2006.01) |
| H05K 1/18 | (2006.01) |
| H05K 7/20 | (2006.01) |

(52) U.S. Cl.
CPC ............ *H05K 1/0206* (2013.01); *H05K 1/18* (2013.01); *H05K 7/20336* (2013.01); *H05K 7/205* (2013.01)

(58) Field of Classification Search
CPC .... H05K 1/0206; H05K 1/18; H05K 7/20336; H05K 7/205
USPC ........................................................ 361/700
See application file for complete search history.

(56) References Cited

U.S. PATENT DOCUMENTS

| 10,043,730 | B2 * | 8/2018 | Refai-Ahmed ......... H01L 24/72 |
| 10,147,664 | B2 | 12/2018 | Refai-Ahmed et al. |
| 10,262,920 | B1 | 4/2019 | Refai-Ahmed et al. |
| 10,529,645 | B2 | 1/2020 | Gandhi et al. |
| 10,720,377 | B2 | 7/2020 | Refai-Ahmed et al. |
| 11,145,566 | B2 | 10/2021 | Refai-Ahmed et al. |
| 11,195,780 | B1 * | 12/2021 | Gandhi ............... H01L 25/0657 |
| 11,246,211 | B1 * | 2/2022 | Refai-Ahmed ..... H01L 23/4006 |
| 11,328,976 | B1 | 5/2022 | Refai-Ahmed et al. |
| 11,330,738 | B1 | 5/2022 | Refai-Ahmed et al. |
| 11,355,412 | B2 | 6/2022 | Gandhi et al. |
| 11,373,929 | B1 | 6/2022 | Refai-Ahmed et al. |
| 11,488,936 | B2 | 11/2022 | Refai-Ahmed et al. |
| 2020/0196482 | A1 * | 6/2020 | Chiang ............. H05K 7/20154 |
| 2021/0208647 | A1 * | 7/2021 | Macias .................... G06F 1/20 |
| 2021/0305127 | A1 | 9/2021 | Refai-Ahmed et al. |

OTHER PUBLICATIONS

U.S. Appl. No. 18/113,585, filed Feb. 23, 2023 Entitled "Thermal Management System for Electronic Device".
U.S. Appl. No. 18/102,065, filed Jan. 26, 2023 Entitled "Floating Heat Spreader With Guided Mechanism".
U.S. Appl. No. 18/121,487, filed Mar. 14, 2023 Entitled "Frame for Coupling of a Thermal Management Device to a Printed Circuit Board".
U.S. Appl. No. 17/688,803, filed Mar. 7, 2022 Entitled "Chip Package With Decoupled Thermal Management".

* cited by examiner

Primary Examiner — Zhengfu J Feng
(74) Attorney, Agent, or Firm — Patterson + Sheridan, LLP

(57) ABSTRACT

Disclosed herein are electronic devices that utilized a thermal bus disposed on a backside of a printed circuit board (PCB) to route heat efficiently to a thermal management device disposed on the front side of the PCB, thus enhancing thermal regulation of integrated circuit (IC) devices mounted on the backside of the PCB.

20 Claims, 7 Drawing Sheets

ELECTRONIC DEVICE WITH BELOW PCB THERMAL MANAGEMENT

TECHNICAL FIELD

Embodiments of the present invention generally relate to electronic devices with one or more thermal buses disposed below one or more chip packages, and in particular, electronic devices having a thermal bus dispose below a printed circuit board that provides a heat transfer path from below a chip package to a thermal management device disposed on top of the chip package that laterally by-passes the chip package.

BACKGROUND

Electronic devices, such as tablets, computers, copiers, digital cameras, smart phones, control systems, automated teller machines, data centers, artificial intelligence system, and machine learning systems among others, often employ electronic and/or photonics components which leverage chip package assemblies for increased functionality and higher component density. Conventional chip packaging schemes often utilize a package substrate, often in conjunction with a through-silicon-via (TSV) interposer substrate and/or other such as FanOut and/or Silicon Bridging and/or substrate with glass and/or Si and/or organic core, to enable a plurality of integrated circuit (IC) dies to be mounted to a single package substrate. The IC dies are mounted to a die side (i.e., top surface) of the package substrate while a ball side (i.e., bottom surface) of the package substrate is mounted to a printed circuit board (PCB). The IC dies may include memory, logic or other IC devices. In many modern devices, one or more of the IC dies of the chip package are stacked one on top of the other to form a chip stack, which shortens routing and allows more IC dies to be utilized in the same foot print of the chip package.

IC dies located deep on a chip stack are often difficult to cool. Heat from a bottom IC die is difficult to transfer through the IC die to a thermal management device disposed on top of the chip package, and the PCB generally has poor thermal conduction making heat flow out from under the stack not an effective option.

Additionally, some IC devices that are integrated the supply of power or other functionality of the chip package are surface mounted below the PCB such that the routing between the IC dies and IC devices is reduced to improve efficiency and speed. These IC devices mounted below the PCB generally rely on ambient air movement or conduction through the PCB and chip package for cooling. However, since these are very inefficient heat transfer paths, the type, power and reliability of IC devices mounted below the PCB is limited.

Therefore, a need exists for electronic devices having a heat management structures disposed below a chip package on the opposite side of the PCB.

SUMMARY

Disclosed herein are electronic devices that utilized a thermal bus disposed on a backside of a printed circuit board (PCB) to route heat efficiently to a thermal management device disposed on the front side of the PCB, thus enhancing thermal regulation of integrated circuit (IC) devices mounted on the backside of the PCB. The thermal management device can be a thermal conductive material with or without exposed surfaces that extend into the surrounding fluid and/or solid state refrigerant. The thermal management device can also be a metal box that optionally has internal extended surface fill with a heat transfer fluid.

In one example, an electronic device includes a PCB, a chip package, a thermal management device, an IC device and a thermal bus. The thermal management device sandwiches the chip package to a first side of the PCB. The IC device is mounted to a second side of the PCB that faces away from the heatsink. The thermal bus sandwiches the IC device to the second side of the PCB. A first conductive heat transfer path is defined between the thermal bus and the thermal management device. The first conductive heat transfer path is disposed laterally outward of the chip package.

In some examples, the IC device is a heat generating device. The IC device may be an IC die, IC chiplet or a surface mounted circuit element. Examples of surface mounted circuit elements may include but are not limited to a voltage regulator, a voltage converter, a resistor, a capacitor, an inductor, and a transformer.

In some examples, the thermal bus further includes one or both of an active or passive heat transfer device.

In some examples, the thermal bus includes a phase change material disposed in a sealed cavity.

In some examples, the electronic device includes a thermal bus that is connected to the heatsink through a thermal via formed through the PCB. In other examples, the thermal bus is connected to thermal management device by a thermally conductive member that is not disposed through the PCB.

In another example, an electronic device includes a PCB, a first chip package, a second chip package, a first thermal management device, a first heat generating IC device, a second heat generating IC device, and a first thermal bus. The first chip package and the second chip package are mounted to a first side of the PCB. The first thermal management device sandwiches the first chip package to the first side of the PCB. The first IC device is mounted to a second side of the PCB that faces away from the first thermal management device. The second heat generating IC device is mounted to the second side of the PCB. The first thermal bus sandwiches the first IC device to the second side of the PCB. The first thermal bus includes one or both of an active or passive heat transfer device. A first conductive heat transfer path is defined between the first thermal bus and the first thermal management device. The first conductive heat transfer path is disposed laterally outward of the first chip package.

In some examples, a second thermal bus sandwiches the second IC device to the second side of the PCB. The second thermal bus includes one or both of an active or passive heat transfer device.

In some examples, a lower junction plate is disposed between the first thermal bus and a second thermal bus. The lower junction plate is coupled to the first thermal bus and the second thermal bus by one or more passive heat transfer devices.

In still other examples, a second thermal management device sandwiches the second chip package to the first side of the PCB. An upper junction plate is disposed between the first thermal management device and the second thermal management device. The upper junction plate is coupled to the first thermal management device and the second thermal management device by one or more passive heat transfer devices. A thermal via couples the upper junction plate to the lower junction plate through the PCB.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

As discussed above, IC dies located deep within a chip stack and IC devices that are located below the PCB are often difficult to cool. Disclosed herein is a thermal bus that is disposed below the chip package on the opposite side of the PCB. The thermal bus is configured to route heat from the side of the PCB opposite the chip package efficiently to a thermal management device residing above the chip package. Thus, the thermal bus improves heat conduction from the IC die closest the PCB. Additionally, when IC devices that present below the PCB, the thermal bus provides a good conductive heat transfer path to the thermal management device, which provides significantly heat removal from the IC device as compared to conventional ambient air convective cooling.

In some examples, thermal conduction from the thermal bus is enhanced by the use of passive heat transfer mechanisms, such as heat pipes and vapor chambers disposed between the thermal bus and the thermal management device. In some examples, conductive vias are formed through the PCB to directly connect the thermal bus to the thermal management device.

In some examples, IC devices such as power control circuit elements are conductively coupled to the thermal bus. The thermal bus provides excellent temperature control of these IC devices, enabling heat generating circuit elements to be safely mounted directly to the PCB below the chip package, when improves speed and processing performance without sacrificing reliability.

Figure 1:
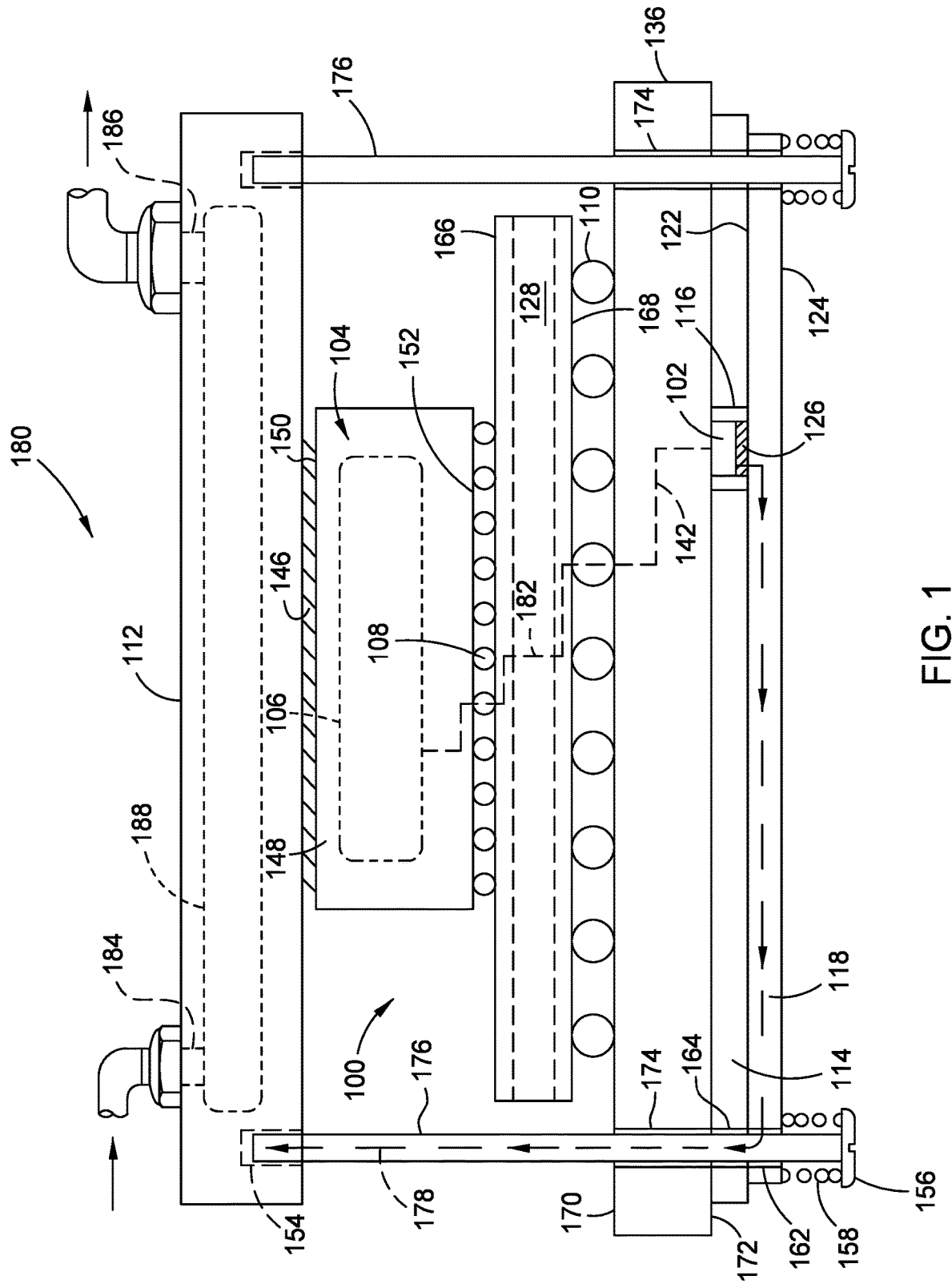
FIG. 1 is a schematic sectional view of one example of an electronic device that includes at least one chip package mounted to a surface of a printed circuit board (PCB), where an opposite surface of the PCB includes an integrated circuit (IC) device interfaced with a thermal bus.

Turning now to FIG. 1, a schematic sectional view of an electronic device 180 that includes one or more chip packages 100 is illustrated. The chip package 100 includes at least one integrated circuit (IC) die 104 mounted to a top surface 166 of a package substrate 128 and a thermal bus 118 mounted to a bottom surface 168 of the package substrate 128. The chip package 100 can be configured in heterogeneous integration with several chiplet and/or optical devices. Optionally, an interposer (not shown) may be disposed between the IC die 104 and the package substrate 128. The package substrate 128 of the chip package 100 may be mounted on top surface 170 of a printed circuit board (PCB) 136 to form the electronic device 180.

A backing plate 114 is secured to a bottom surface 172 of the PCB 136 to provide additional rigidity and stiffness to the electronic device 180. The backing plate 114 may be secured to the PCB 136 by clamps, fasteners, adhesives or other suitable technique. The backing plate 114 is typically fabricated from a metal or other rigid material. Optionally, the backing plate 114 and the thermal bus 118 may be integrated into a single structure or formed from the same mass of material.

At least one integrated circuit (IC) device 102 is surface mounted to the bottom surface 172 of the PCB 136. The backing plate 114 generally includes an aperture 116 through which the IC device 102 extends such that the IC device 102 does not interfere with the function of the backing plate 114. Since the IC device 102 and the IC die 104 are disposed on opposite sides of the PCB 136, additional space is available for other devices on the chip package side of the PCB 136.

The IC device 102 is coupled to functional circuitry 106 of the IC die 104, rather than being formed within the IC die 104 or located on the package substrate 128 or other location within the chip package 100. Thus, the IC device 102 is very close to the IC die 104 which enables excellent performance. Additionally, as the IC device 102 is not formed within the IC die 104, space normally occupied by on-die circuitry is now free within the IC die 104 for additional IC devices, improved power routing, and the like.

The IC device 102 is generally a heat generating IC device. That is, the IC device 102 generates heat when in use. Examples of an IC device 102 include, but are not limited to, a voltage regulator, a voltage converter, a resistor, a capacitor, an inductor, and a transformer. In the example depicted in FIG. 1, the IC device 102 is part of the power delivery circuitry that routes power from the PCB 136 to the functional circuitry 106 of the IC die 104. Advantageously as the IC device 102 may be located very close to and even directly below the IC die 104, routing between the functional circuitry 106 of the IC die 104 and the IC device 102 is relatively short, thus improving performance while reducing capacitive coupling. Although in FIG. 1 only a single IC device 102 is shown, as many IC devices 102 may be utilized as desired and as space permits.

The IC device 102 is thermally regulated by use of at least one thermal bus 118. The thermal bus 118 also enhances heat transfer from the IC dies 104 disposed near the package substrate 128. One thermal bus 118 is shown in FIG. 1 although multiple thermal buses 118 may be utilized. The thermal bus 118 generally routes heat from the IC device 102 laterally below the bottom surface 172 of the PCB 136 and around (rather than through) the chip package 100 to a thermal management device 112 disposed on top of the IC die 104, as shown by arrows that define a conductive heat transfer path 178. The conductive heat transfer path 178 provides a more efficient heat transfer path between the IC device 102 and the thermal management device 112 as compared to conducting heat vertically through the PCB 136 and the package substrate 128 which are poor thermal conductors. Thus, the conductive heat transfer path 178 enables IC devices 102 to operate at higher power as compared to conventions designs that primarily rely convectional heat transfer to remove heat from the IC device 102. The use of the below-PCB thermal bus 118 is particularly advantageously when the IC device 102 is configured as a component of the power delivery system of the IC die 104, as the excellent temperature control provided by the thermal bus 118 allows high-powered IC devices 102 such as power transformers, power converters and the like, to be positioned directly below the IC dies 104 where fast response and diminished capacitive coupling result in robust performance of the electronic device 180. Additionally, the thermal bus 118 improves heat conduction from the IC die(s) 102 closest the PCB 136, thus improving performance and reliability of the chip package 100. Different examples of how the conductive heat transfer path 178 may be configured are later described below.

Continuing to describe the thermal bus 118, the thermal bus 118 generally is fabricated from a thermally conductive material, with or without extended exposed surfaces that enhance heat transfer. The thermal bus 118 may include a cavity include a heat transfer fluid, refrigerant, or phase change material is disposed and/or circulated. Extended exposed surfaces, such as fins, baffles and the like, may project into the cavity to enhance heat transfer. The thermal bus 118 may also be a solid-state heat pump, i.e., thermoelectric device, or a metal box optionally having internal extended surface filled with fluid. The thermal bus 118 generally includes at least one or both of an active or passive heat transfer device. Examples of active heat transfer devices includes thermoelectric coolers, forced air heat exchangers, forced liquid heat exchangers, and the like. Examples of passive heat transfer devices includes vapor chambers, heat pipes, phase change materials, fins, and the like. Thermal interface material (TIM) 126 may be utilized between the IC device 102 and a first side 122 of the thermal bus 118 to enhance heat transfer therebetween. The TIM 126 may be a thermal grease, thermal gel, thermally conductive pad or other suitable material.

In the example depicted in FIG. 1, the thermal bus 118 is coupled to the thermal management device 112 of the electronic device 180 using a plurality of conductive members 176. In one example, the conductive member 176 may be configured as a metal fastener, but in other examples described below, the conductive member 176 may be configured differently. The conductive member 176 includes a threaded end that engages a threaded hole 154 formed in the lower surface of the thermal management device 112 that faces the IC die 104. The conductive member 176 extends through apertures 174, 164, 162 formed in the PCB 136, backing plate 114 and thermal bus 118. The conductive member 176 includes a head 156 that retains a spring 158 between the head 156 and a bottom surface 124 of the thermal bus 118. When the conductive member 176 is threaded into the threaded hole 154 formed in the thermal management device 112, the spring 158 is compressed and urges the thermal bus 118 against both the backing plate 114 and, through the TIM 126, the IC device 102.

Continuing to refer to FIG. 1, the IC die 104 of the chip package 100 includes the functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

Figure 2:
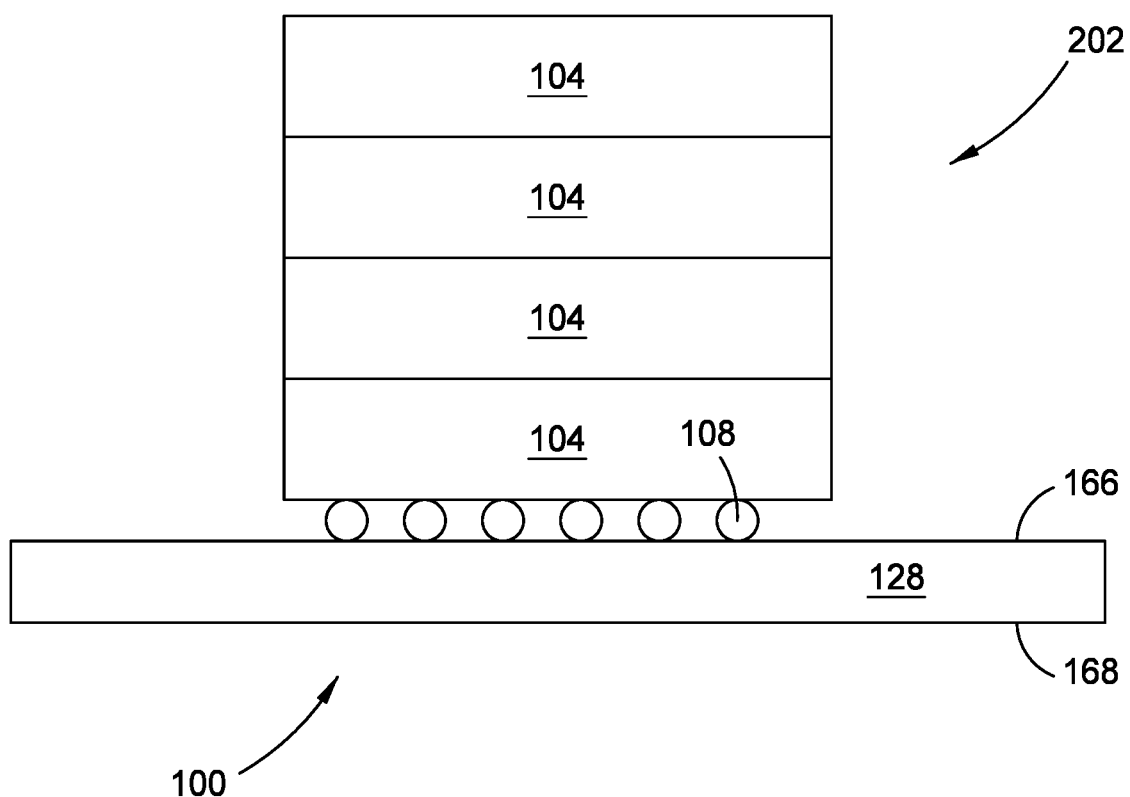
FIG. 2 is another example of a chip package that may be utilized in the electronic device illustrated in FIG. 1.

FIG. 2 example of a chip package 100 that may be utilized in the electronic device 180 illustrated in FIG. 1 that includes a chip stack 202. The chip stack 202 includes a plurality of IC dies 104 that are stacked one on top of the other. Although four IC dies 104 are illustrated in the single chip stack 202 shown in FIG. 2, the number of IC dies 104 comprising the chip stack 202 may vary from one to as many as can fit within the chip package 100. Additionally, although only one chip stack 202 is shown in FIG. 2, one or more additional IC dies 104 and/or one or more additional chip stacks 202 may be disposed adjacent the chip stack 202 shown in FIG. 2.

Referring back to FIG. 1, the IC die 104 includes a die body 148 having a die bottom surface 152 and a die top surface 150 connected by the die sidewall 134. Heat may be conducted from the die top surface 150 of the die body 148 to the thermal management device 112 through a layer of TIM 146. The functional circuitry 106 is disposed within the die body 148 and includes routing that terminates on the die bottom surface 152 of the IC die 104. In the example depicted in FIG. 1, the functional circuitry 106 of the IC die 104 is electrically and mechanically coupled to package circuitry 182 formed in the package substrate 128 by interconnects 108. In one example, the interconnects 108 are solder connections, such as solder bumps. The interconnects 108 may alternatively be formed by a hybrid bond layer or other suitable technique.

The package substrate 128 generally includes at least an upper build-up layer disposed on a core. Optionally, a lower build-up layer may be disposed on the other side of the core from the upper build-up layer. The build-up layers includes a plurality of conductive layers and vias that are patterned to provide routing comprising a portion of the package circuitry 182. One end of the package circuitry 182 formed in the upper build-up layer terminates at bond pads formed on a top surface 166 of the package substrate 128 where the package circuitry 182 connects to the contact pads of the IC die 104. The other end of the package circuitry 182 formed in the package substrate 128 terminates at bond pads formed on the bottom surface 168 of the package substrate 128.

The package circuitry 182 is connected by solder balls 110 to circuitry 142 of the PCB 136 that terminates at the top surface 170 of the PCB 136. The functional circuitry 106 of the IC die 104 is also coupled by the package circuitry 182 of the package substrate 128 and the circuitry 142 of the PCB 136 to the functional circuitry of the IC device 102. The circuitry 142 of the PCB 136 may also connect the functional circuitry of the IC device 102 to a power, ground or signal source exterior to the electronic device 180 through a PCB connector, such as a backplane connector, audio/video connector, card edge connector, and the like.

Figure 3:
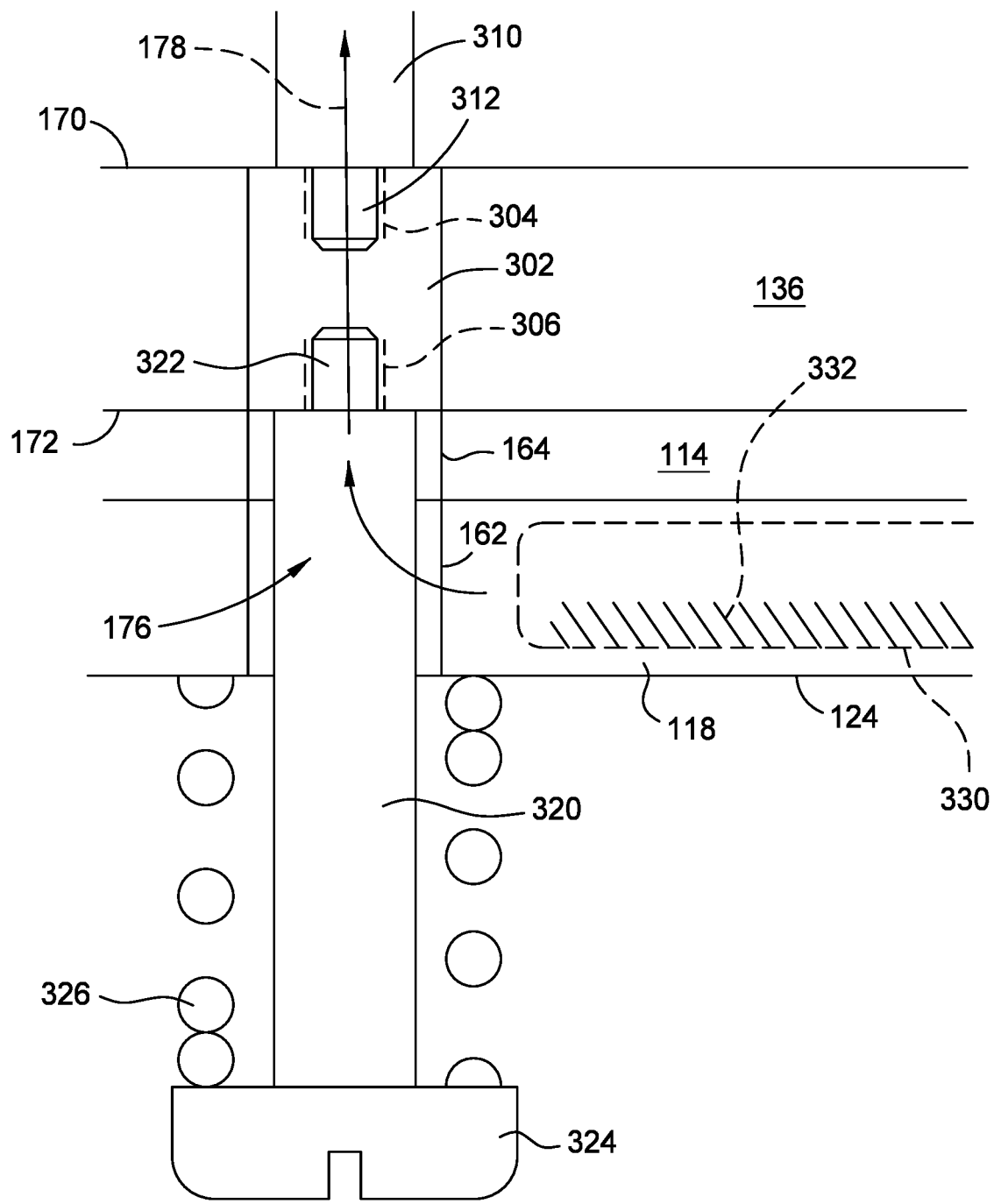
FIG. 3 is a schematic sectional view of a portion of the electronic device illustrating one example of a portion of a conductive heat transfer path extending from the thermal bus through the PCB to a thermal management device.

FIG. 3 is a schematic sectional view of a portion of the electronic device 180 illustrating one example of a portion of a conductive heat transfer path 178 extending from the thermal bus 118 through the PCB 136 to the thermal management device 112. In the example depicted in FIG. 3, the thermal bus 118 is configured as a vapor chamber and includes a sealed cavity 330 partially filled with a phase change material 332. Alternatively, the cavity 330 partially filled with the phase change material 332 shown in FIG. 3 may be part of one or more heat pipes. The phase change material 332 within the cavity 330 functions to transfer heat from the portion of the thermal bus 118 contacting the IC device 102 to the portion of the thermal bus 118 interfacing with the conductive member 176, where the heat is then conducted through the conductive member 176 to thermal management device 112 (as shown in FIG. 1).

In the example depicted in FIG. 3, the conductive member 176 is configured in three portions, such as a first portion 320, a second portion 310, and a thermal via 302. The first portion 320, the second portion 310, and the thermal via 302 are generally fabricated from a material with high thermal conductivity, for example a metal such as copper, among others.

The first portion 320 of the conductive member 176 includes a threaded section 322 and a head 324. The first portion 320 extends through the apertures 164, 162 formed in the backing plate 114 and the thermal bus 118. The head 324 retains a spring 326 disposed between the head 324 and the bottom surface 124 of the thermal bus 118.

The thermal via 302 is disposed through the PCB 136 and is aligned with the apertures 162, 164. The thermal via 302 may be staked, plated or otherwise formed or disposed in the PCB 136. The thermal via 302 includes a first threaded hole 306 and a second threaded hole 304. The first threaded hole 306 is configured to receive the threaded section 322 defined at the end of the first portion 320 of the conductive member 176. The threaded section 322 of the first portion 320 of the conductive member 176 is threaded into the first threaded hole 306 formed in the thermal via 302, the spring 326 is compressed and urges the thermal bus 118 against both the backing plate 114 (and, through the TIM 126, against the IC device 102 as shown in FIG. 1).

The second threaded hole 304 of the thermal via 302 is configured to receive a threaded section 312 defined at the end of the second portion 310 of the conductive member 176. Similar to as shown in FIG. 1, the opposite end of the second portion 310 includes threaded portion that engages a threaded hole formed in the thermal management device 112.

The conductive member 176 with thermal via 302 provides a very efficient conductive transfer path 178 through the PCB 136 directly to the thermal management device 112. As discussed above, the efficient conductive transfer path 178 allows high powered IC devices 102 to be utilized on the bottom surface 172 of the PCB 136 that enhance the performance of the electronic device 180 while also enhancing cooling of IC dies 104 disposed close to the PCB 136.

Figure 4:
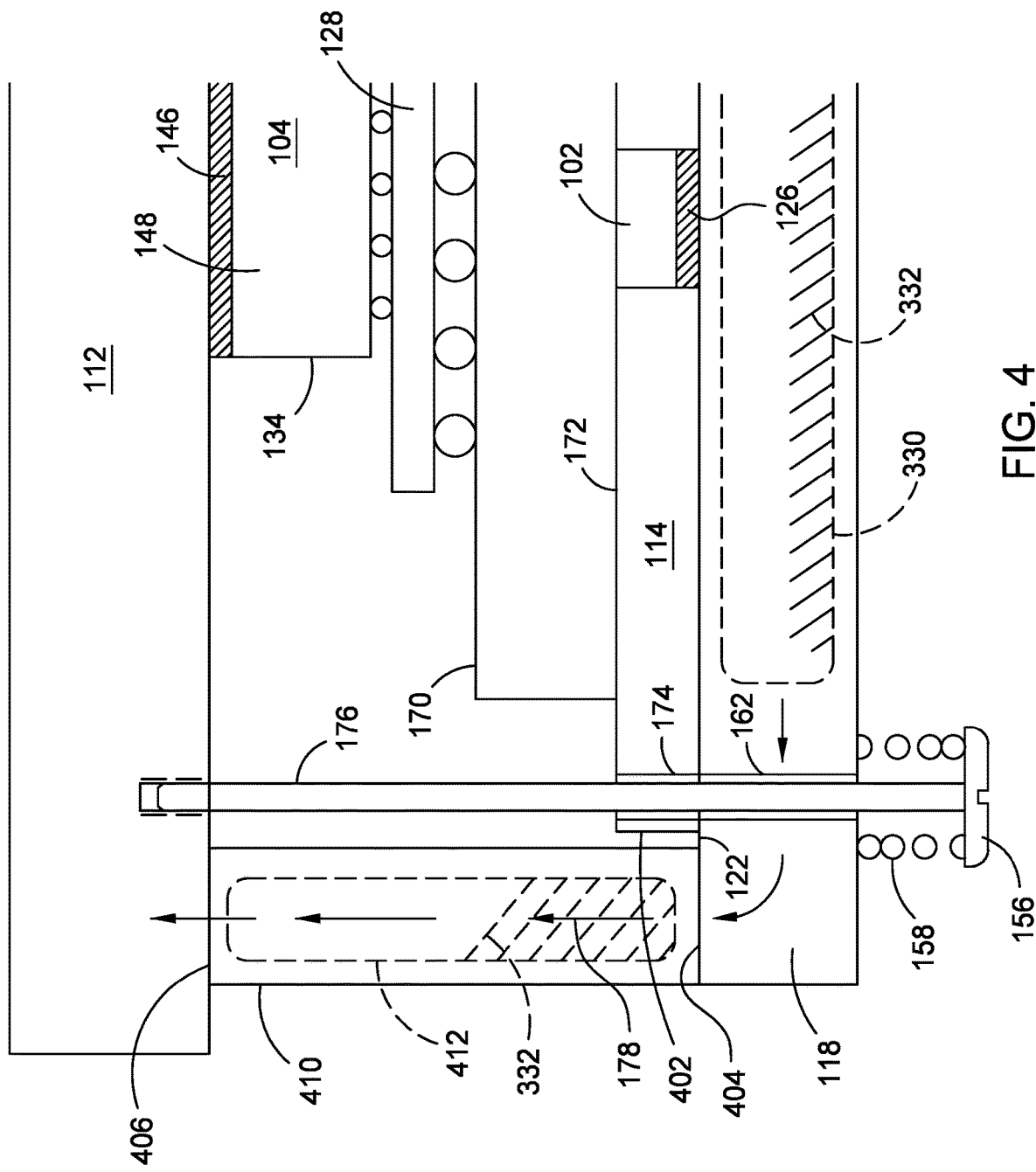
FIG. 4 is a schematic sectional view of a portion of the electronic device illustrating another example of a portion of a conductive heat transfer path extending from the thermal bus around the PCB to a thermal management device.

FIG. 4 is a schematic sectional view of a portion of the electronic device 180 illustrating another example of a portion of the conductive heat transfer path 178 extending through a conductive member 410 from the thermal bus 118 around an outer edge 402 of the PCB 136 to the thermal management device 112. The conductive member 410 may be utilized alternatively or in addition to any other conductive member, such as the conductive member 176.

The conductive member 410 is generally disposed proximate an outer edge 408 of the thermal bus 118. The conductive member 410 has a first end 404 disposed in contact with the first side 122 of the thermal bus 118. Optionally, TIM 126 (not shown in FIG. 4) may be disposed between the first end 404 of the conductive member 410 and the thermal bus 118. The first end 404 of the conductive member 410 may be coupled to the thermal bus 118 in any suitable manner, such as with fasteners, adhesives, clamping and the like. A second end 406 of the conductive member 410 is disposed in contact with the thermal management device 112. Optionally, TIM 126 (not shown in FIG. 4) may be disposed between the second end 406 of the conductive member 410 and the thermal management device 112. The second end 406 of the conductive member 410 may be coupled to the thermal management device 112 in any suitable manner, such as with fasteners, adhesives, clamping and the like. Alternatively, the conductive member 410 may be part of one of the thermal bus 118 or the thermal management device 112. For example, the thermal management device 112 may include a leg (e.g., the conductive member 410) that extends downward to the thermal bus 118.

In one example, the conductive member 410 is formed form a thermally conductive material, such as a metal. Suitable metals include copper, aluminum, and stainless steel, among others. The conductive member 410 may optionally include active and/or passive heat transfer devices. In the example depicted in FIG. 4, the conductive member 410 includes a sealed cavity 412 that includes a phase change material 332. The cavity 412 may form part of a heat pipe or vapor chamber. The phase change material 332 increases the efficiency of heat being transferred from the thermal bus 118 to the thermal management device 112, with allows for high-powered IC devices 102 to be beneficially utilized below the PCB 136 as described above.

Figure 5:
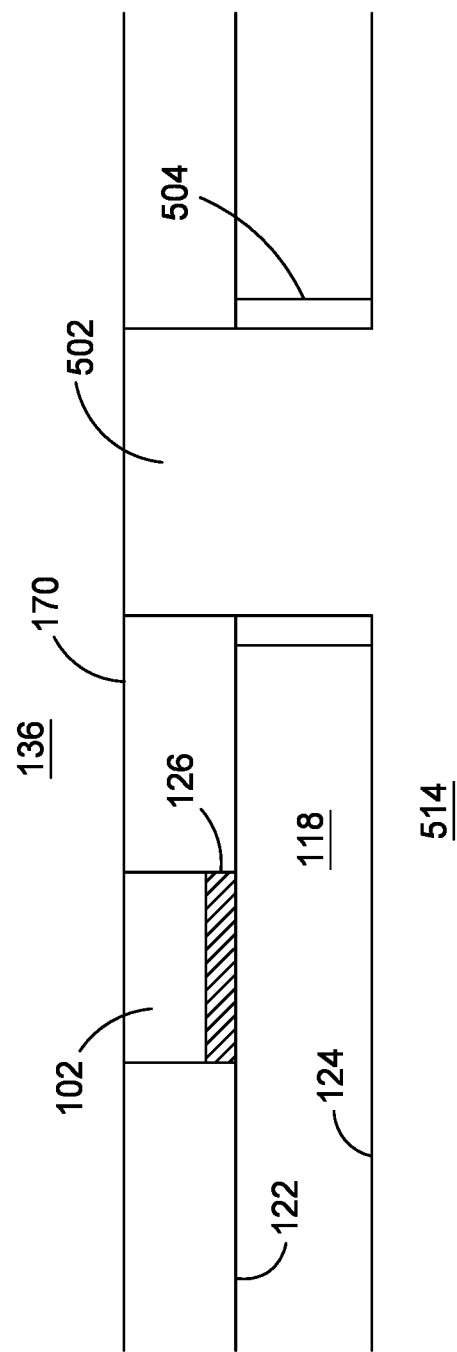
FIG. 5 is a schematic partial sectional view of the electronic device of FIG. 1, wherein the thermal bus is disposed on an opposite side of a backing plate.

FIG. 5 is a schematic partial sectional view of the electronic device 180 of FIG. 1, wherein the thermal bus 118 is disposed on an opposite side of a backing plate 514. In the example depicted in FIG. 5, the thermal bus 118 include an aperture 502 through which a pad 504 projecting from the backing plate 514 extends into contact with the bottom surface 170 of the PCB 136. The pad 504 generally has a height that is slightly greater that the combined height and thickness of the IC device 102 and the thermal bus 118 such that good contact is made between the IC device 102 and the thermal bus 118 through the TIM 126.

Figure 6:
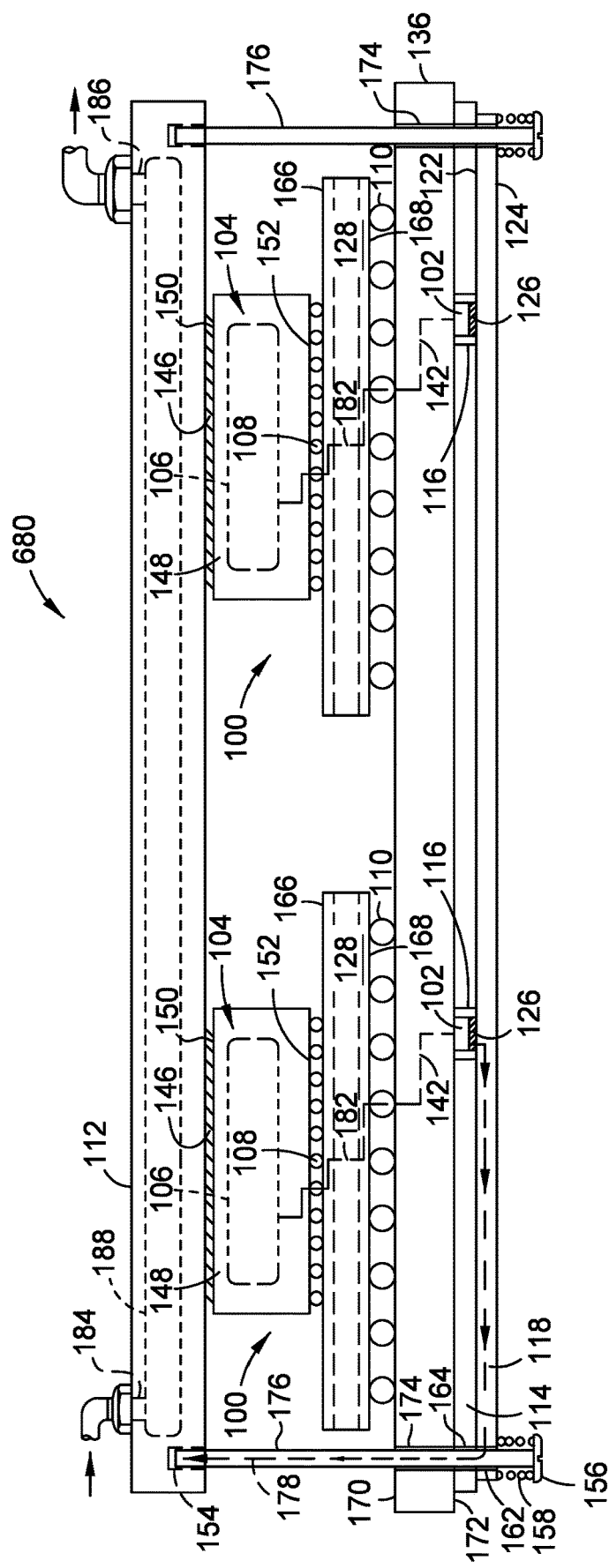
FIG. 6 is a schematic sectional view of another example of an electronic device that includes a plurality of chip packages mounted to a PCB and sharing a common a thermal bus.

FIG. 6 is a schematic sectional view of another example of an electronic device 680 that includes a plurality of chip packages 100 mounted to a common PCB 136 and sharing a common a thermal bus 118. The configuration of the electronic device 680 is substantially identical to that of the electronic device 180 described above except of the number of chip packages 100. Although only two chip packages 100 are shown in the example depicted in FIG. 6, as many chip packages 100 may be utilized as desired and as space permits. At least one IC device 102 is surface mounted on the bottom surface 170 of the PCB 136 below at least one or more of the chip packages 100. In the example depicted in FIG. 6, one or more IC devices 102 are surface mounted on the bottom surface 170 of the PCB 136 below at least one, or more, or all of the chip packages 100.

Figure 7:
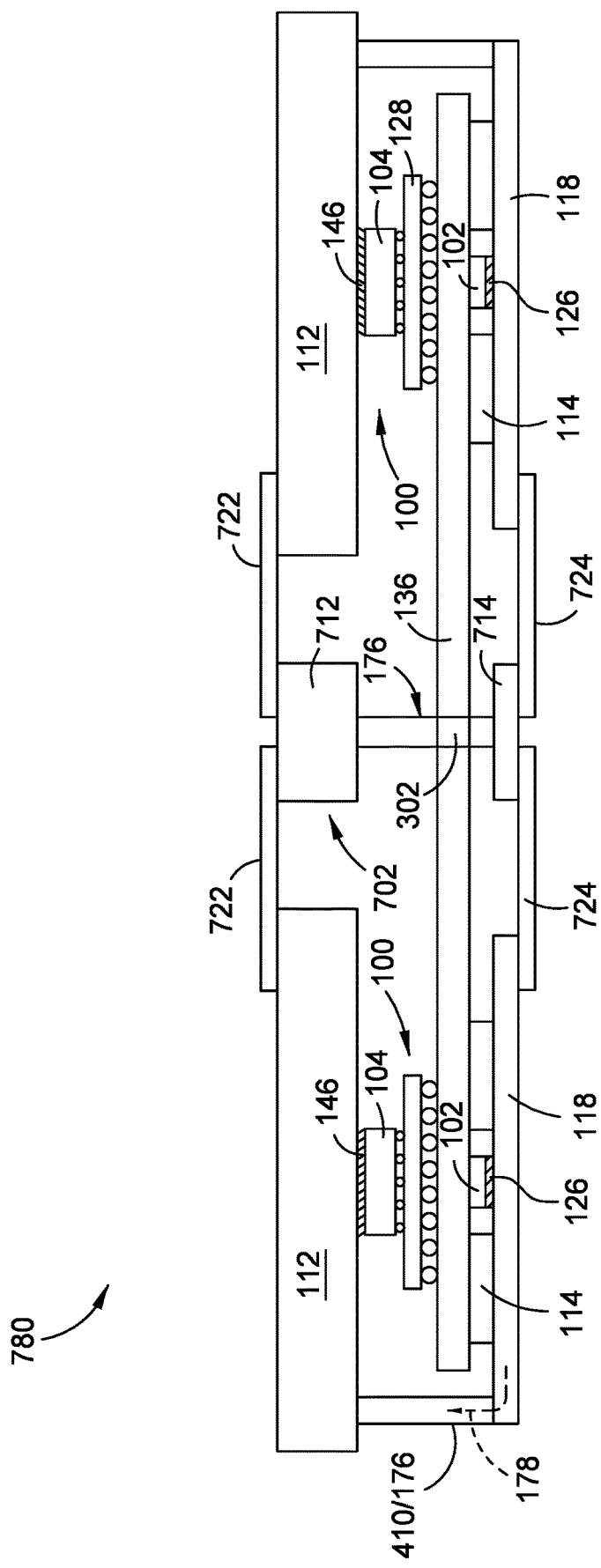
FIG. 7 is a schematic sectional view of another example of an electronic device that includes a plurality of chip packages mounted to a PCB and interfaced with different thermal buses.

FIG. 7 is a schematic sectional view of another example of an electronic device 780 that includes a plurality of chip packages 100 mounted to a common PCB 136 and interfaced with different thermal buses 118. At least one IC device 102 is respectively sandwiched between the PCB 136 and each of the thermal buses 118. The electronic device 780 also includes a plurality of thermal management devices 112. Alternatively, a single thermal management device 112 may be utilized within the electronic device 780 and coupled to each of the different thermal buses 118. In the example depicted in FIG. 7, each thermal bus 118 has a corresponding thermal management device 112.

A plurality of conductive members generally provide conductive heat transfer paths 178 between the thermal buses 118 and the thermal management devices 112. The conductive members may be configured as any one or more of the conductive members 176, 410 described above. The conductive heat transfer path 178 may also be routed between thermal buses 118 using heat pipes 724 or other passive or active heat transfer device. In the example, one end of the heat pipe 724 is disposed in contact with one of the thermal buses 118, while the other end of the heat pipe 724 is disposed in conductive contact with another one of the thermal buses 118. The other end of the heat pipe 724 may be disposed in direct contact with the other thermal bus 118, or be disposed in direct contact with a lower junction plate 714, as depicted in FIG. 7. When the lower junction plate 714 is utilized, heat can transfer between the thermal buses 118 through the lower junction plate 714 via the heat pipes 724. This allows heat from a hotter IC device 102 in contact with one thermal bus 118 to efficiently move heat to a thermal bus 118 that is in contact with a cooler IC device 102, which more efficiently removes heat from all the IC devices 102.

In the example depicted in FIG. 7, at least one or more conductive members 176 are disposed between at least two of the chip packages 100 of the electronic device 780. The between-package conductive members 176 utilize a thermal via 302 formed through the PCB 136 such as described with reference to FIG. 3. The between-package conductive member 176 may be directly coupled to one of the thermal management devices 112, or coupled to an upper junction plate 712. The upper junction plate 712 is coupled to the thermal management devices 112 via the heat pipes 724 or other active or passive heat transfer device. In the example depicted in FIG. 7, one heat pipe 722 couples the upper junction plate 712 to one thermal management device 112, while another heat pipe 722 couples the upper junction plate 712 to another one of the thermal management devices 112. This allows heat removed from the IC devices 102 in contact with the thermal buses 118 to efficiently move heat via conduction to the thermal management device 112, which improves the performance of the electronic device 780.

Thus, the thermal bus disclosed herein is configured to route heat from IC devices disposed on the side of the PCB opposite the chip package efficiently to a thermal management device residing above the chip package. The improved thermal management of the IC devices disposed on the bottom side of the PCB enables higher power IC devices to be utilized closer to the chip packages without significant performance degradation. The thermal bus provides an excellent conductive heat transfer path from the IC device to the thermal management device. In some examples, heat generating IC devices such as power control circuit elements are conductively coupled to the thermal bus directly below the chip packages which provide robust power delivery without capacitive coupling within the routings while also opening space on the chip package side of the PCB for additional processing components and circuit elements. Thus, speed and processing performance is enhanced without sacrificing reliability or compactness.

While the foregoing is directed to embodiments of the present invention, other and further embodiments of the invention may be devised without departing from the basic scope thereof, and the scope thereof is determined by the claims that follow.

What is claimed is:

1. An electronic device comprising:
   a printed circuit board (PCB);
   a chip package;
   a thermal management device sandwiching the chip package to a first side of the PCB;
   an integrated circuit (IC) device mounted to a second side of the PCB that faces away from the thermal management device;
   a backing plate disposed against the second side of the PCB and having an opening through which the IC device extends;
   a thermal bus sandwiching the IC device to the second side of the PCB, the thermal bus sandwiching the backing plate to the second side of the PCB; and
   a first conductive heat transfer path defined between the thermal bus and the thermal management device, the first conductive heat transfer path disposed laterally outward of the chip package.

2. The electronic device of claim 1, wherein the thermal bus further comprises:
   one or both of an active or passive heat transfer device.

3. The electronic device of claim 1, wherein the thermal bus further comprises:
   a phase change material disposed in a sealed cavity.

4. The electronic device of claim 1, wherein the thermal bus further comprises:
   a phase change material disposed in a heat pipe.

5. The electronic device of claim 1, wherein the thermal bus further comprises:
   a phase change material disposed in a vapor chamber.

6. The electronic device of claim 1, wherein the thermal bus is connected to the thermal management device through a thermal via formed through the PCB.

7. The electronic device of claim 1, wherein the thermal bus is connected to the thermal management device by a thermally conductive member that is not disposed through the PCB.

8. The electronic device of claim 7, wherein the thermally conductive member has a phase change material disposed therein.

9. The electronic device of claim 1, wherein the thermal management device further comprises:
   one or both of an active or passive heat transfer device.

10. The electronic device of claim 1 further comprising:
    a thermal interface material disposed between the IC device and the thermal bus.

11. The electronic device of claim 1, wherein the IC device further comprises at least one of a voltage regulator, a voltage converter, a resistor, a capacitor, an inductor, or a transformer.

12. An electronic device comprising:
    a printed circuit board (PCB);
    a first chip package mounted to a first side of the PCB;
    a second chip package mounted to the first side of the PCB;
    a first thermal management device sandwiching the first chip package to the first side of the PCB;

a first heat generating integrated circuit (IC) device mounted to a second side of the PCB that faces away from the first thermal management device;

a second heat generating integrated circuit (IC) device mounted to the second side of the PCB;

a backing plate disposed against the second side of the PCB and having a first opening through which the first heat generating IC device extends;

a first thermal bus sandwiching the first IC device to the second side of the PCB, the first thermal bus sandwiching the backing plate to the second side of the PCB, the first thermal bus including one or both of an active or passive heat transfer device; and a first conductive heat transfer path defined between the first thermal bus and the first thermal management device, the first conductive heat transfer path disposed laterally outward of the first chip package.

13. The electronic device of claim 12, wherein the first thermal bus sandwiches the second IC device to the second side of the PCB, and wherein the first thermal management device sandwiches the second chip package to the first side of the PCB.

14. The electronic device of claim 12 further comprising:
a second thermal bus sandwiching the second IC device to the second side of the PCB, the second thermal bus including one or both of an active or passive heat transfer device.

15. The electronic device of claim 14, wherein the first thermal management device sandwiches the second chip package to the first side of the PCB.

16. The electronic device of claim 14 further comprising:
a second thermal bus sandwiching the second IC device to the second side of the PCB, the second thermal bus including one or both of an active or passive heat transfer device.

17. The electronic device of claim 16 further comprising:
a lower junction plate disposed between the first thermal bus and the second thermal bus, the lower junction plate coupled to the first thermal bus and the second thermal bus by one or more passive heat transfer devices.

18. The electronic device of claim 17 further comprising:
a second thermal management device sandwiching the second chip package to the first side of the PCB;

an upper junction plate disposed between the first thermal management device and the second thermal management device, the upper junction plate coupled to the first thermal management device and the second thermal management device by one or more passive heat transfer devices; and a thermal via coupling the upper junction plate to the lower junction plate through the PCB.

19. The electronic device of claim 18, wherein the first thermal bus is connected to the first thermal management device by a thermally conductive member that is not disposed through the PCB.

20. The electronic device of claim 1, wherein the IC device is a heat generating device, and wherein the thermal bus further comprises one or both of an active or passive heat transfer device.

* * * * *